United States Patent
Nagaseki

(10) Patent No.: US 8,293,662 B2
(45) Date of Patent: Oct. 23, 2012

(54) METHOD OF MANUFACTURING SEMICONDUCTOR DEVICE, APPARATUS FOR MANUFACTURING SAME, AND STORAGE MEDIUM

(75) Inventor: Sumie Nagaseki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 350 days.

(21) Appl. No.: 12/673,109

(22) PCT Filed: Aug. 5, 2008

(86) PCT No.: PCT/JP2008/064043
§ 371 (c)(1),
(2), (4) Date: Feb. 11, 2010

(87) PCT Pub. No.: WO2009/022581
PCT Pub. Date: Feb. 19, 2009

(65) Prior Publication Data
US 2012/0100727 A1 Apr. 26, 2012

(30) Foreign Application Priority Data

Aug. 10, 2007 (JP) ................ 2007-210263

(51) Int. Cl.
 *H01L 21/316* (2006.01)
 *B05C 5/00* (2006.01)
(52) U.S. Cl. ............... 438/790; 118/300; 257/E21.273
(58) Field of Classification Search ........... 118/300; 257/E21.273; 438/780, 781, 786–790
See application file for complete search history.

(56) References Cited

U.S. PATENT DOCUMENTS

| 5,561,318 | A * | 10/1996 | Gnade et al. ............ 257/638 |
|---|---|---|---|
| 6,603,204 | B2 | 8/2003 | Gates et al. |
| 6,716,742 | B2 | 4/2004 | Gates et al. |
| 6,831,366 | B2 | 12/2004 | Gates et al. |
| 2003/0213958 | A1 | 11/2003 | Nakagawa et al. |
| 2006/0054205 | A1 | 3/2006 | Yabe et al. |
| 2007/0189972 | A1 | 8/2007 | Chiba et al. |

FOREIGN PATENT DOCUMENTS

| JP | 2 144947 | 6/1990 |
|---|---|---|
| JP | 2001 217234 | 8/2001 |
| JP | 2002 64091 | 2/2002 |
| JP | 2004 121962 | 4/2004 |
| JP | 2005 245817 | 9/2005 |
| JP | 2008 4628 | 1/2008 |
| KR | 2003-0088376 | 11/2003 |

OTHER PUBLICATIONS

Office Action issued May 30, 2011, in Korean Patent Application No. 10-2010-7002833 with English translation.

* cited by examiner

*Primary Examiner* — Julio J Maldonado
*Assistant Examiner* — Daniel Shook
(74) *Attorney, Agent, or Firm* — Oblon, Spivak, McClelland, Maier & Neustadt, L.L.P.

(57) ABSTRACT

A method of manufacturing a semiconductor device includes steps of: generating positively or negatively charged fine bubbles having substantially zero buoyancy in a coating solution as an insulating film forming material; coating the coating solution including the bubbles on a substrate to form a coating film; and baking the coating film by heating the substrate before the bubbles are removed to obtain a porous low dielectric constant insulating film.

8 Claims, 11 Drawing Sheets

METHOD OF MANUFACTURING SEMICONDUCTOR DEVICE, APPARATUS FOR MANUFACTURING SAME, AND STORAGE MEDIUM

FIELD OF THE INVENTION

The present invention relates to a technique of manufacturing a semiconductor device; and, more particularly, to a technique of forming a porous low dielectric constant insulating film used as an interlayer dielectric film.

BACKGROUND OF THE INVENTION

A chemical vapor deposition (CVD) method has been known as a method of forming a porous SiOCH film. However, a coating method is advantageous in terms of simplicity of an apparatus and processes.

In the coating method, first, in order to form the crosslink structure of SiOCH, a precursor is dissolved in a solvent to manufacture a coating solution. Then, the coating solution is coated on a substrate by a spinning method, for example. Then, the substrate is heated so that the solvent evaporates to be removed and the precursor is reacted therewith to form the crosslink structure, for example. Therefore, a silicon oxide film such as the SiOCH film is formed. Then, a plasma process such as etching or ashing is performed on the silicon oxide film to form a recessed portion. Thereafter, a barrier film and a metal wiring are laminated in the recessed portion from bottom to top in that order. Therefore, a circuit is formed. The barrier film is for preventing a metal from being diffused from the metal wiring to the silicon oxide film.

For example, the pores in the silicon oxide film, as illustrated in FIGS. 11A and 11B, are formed by combining a low boiling point compound such as an organic material that evaporates at a low temperature with, e.g., silicon in the precursor (refer to FIG. 11A); by coating the coating solution including the low boiling point compound on the substrate; and by heating the substrate to evaporate the low boiling point compound and to remove the low boiling point compound from the surface of the substrate (refer to FIG. 11B).

Therefore, it is required that the low boiling point compound (i) has a molecule-size same as the designed diameter of pores to be formed in the film, (ii) evaporates at the bake temperature of the coating film, and (iii) has a dispersion property that enables the low boiling point compound to uniformly disperse in the precursor. To that end, huge amounts of time and cost are required for selecting or developing the low boiling point compound.

Since the pores are formed by the low boiling point compound evaporating to leak to the outside of the insulating film, the pores become open pores connected to the outside of the insulating film. Therefore, when the barrier film is formed, the metal may be diffused from the barrier film to the silicon oxide film, thereby deteriorating the insulation property of the silicon oxide film. Further, since plasma enters the inside of the film during etching or ashing, the film is easily damaged. In addition, the mechanical strength (hardness and Young's Modulus) is low.

A technique of cleansing industrial machinery by using bubbles having a micrometer or nanometer size, so called, micro bubbles (nano bubbles) has been disclosed in Japanese patent Application Publication No. 2004-121962 (in particular, paragraph Nos. [0031] to [0037]). Moreover, a technique of stably manufacturing such nano bubbles has been disclosed in Japanese patent Application Publication No. 2005-245817 (in particular, paragraph Nos. [0012] and [0013]).

However, detailed means of solving the above problems have not been described in either document.

In addition, the technique of forming a porous low dielectric constant film on a substrate by the plasma CVD method has been disclosed in Japanese patent Application Publication No. 2002-64091 (in particular, paragraph Nos. [0008] to [0010]) and Japanese patent Application Publication No. 2005-500669 (in particular, paragraph Nos. [0025] and [0026]). However, the above problems have not been considered.

SUMMARY OF THE INVENTION

In view of the above, the present invention is contrived to solve the aforementioned problems. An object of the present invention is to provide a method of manufacturing a semiconductor device capable of easily forming a porous low dielectric constant insulating film on a substrate by a coating method; and an apparatus for manufacturing same.

In accordance with the present invention, the method of manufacturing the semiconductor device includes steps of: generating positively or negatively charged fine bubbles having substantially zero buoyancy in a coating solution as an insulating film forming material; coating the coating solution including the bubbles on a substrate to form a coating film; and baking the coating film by heating the substrate before the bubbles are removed to obtain a porous low dielectric constant insulating film.

In accordance with the present invention, since a compound for obtaining a porous film is not necessary, it is not needed to select or develop the compound. As a result, a low dielectric constant film may be easily manufactured. In addition, since the porous film is obtained while the bubbles are soaked in a coating solution, the low dielectric constant film is not surrounded by the open pores but closed pores are formed. Therefore, the mechanical strength of the film may be improved.

It is preferable that the low dielectric constant insulating film serves as an interlayer dielectric film.

Further, it is preferable that the insulating film forming material includes silicon, oxygen, carbon, and hydrogen.

It is preferable that, after the coating film is baked, diameters of the bubbles are equal to or smaller than 50 nm.

The step of baking the coating film may include forming an electric field to attract the bubbles in the coating solution to the substrate.

Moreover, in accordance with the present invention, a semiconductor manufacturing apparatus includes a bubble generating unit for generating positively or negatively charged fine bubbles having substantially zero buoyancy in a coating solution as an insulating film forming material; a coating unit for coating a coating solution including the bubbles on a substrate for forming a semiconductor device to form a coating film; a heating unit for baking the coating film by heating the substrate on which the coating solution including the bubbles is coated to obtain a porous low dielectric constant insulating film; and a transfer unit for transferring the substrate between the coating unit and the heating unit.

The heating unit may include an electric field generating unit for forming an electric field for attracting the bubbles in the coating solution to the substrate.

Moreover, in accordance with the present invention, a storage medium in which a computer program is stored, wherein the computer program includes steps for performing the method of manufacturing a semiconductor device having the aforementioned characteristics.

DETAILED DESCRIPTION OF THE EMBODIMENT

An example of an apparatus for manufacturing a semiconductor device for performing a method of present invention will be described with reference to FIGS. 1 to 3.

Figure 1:
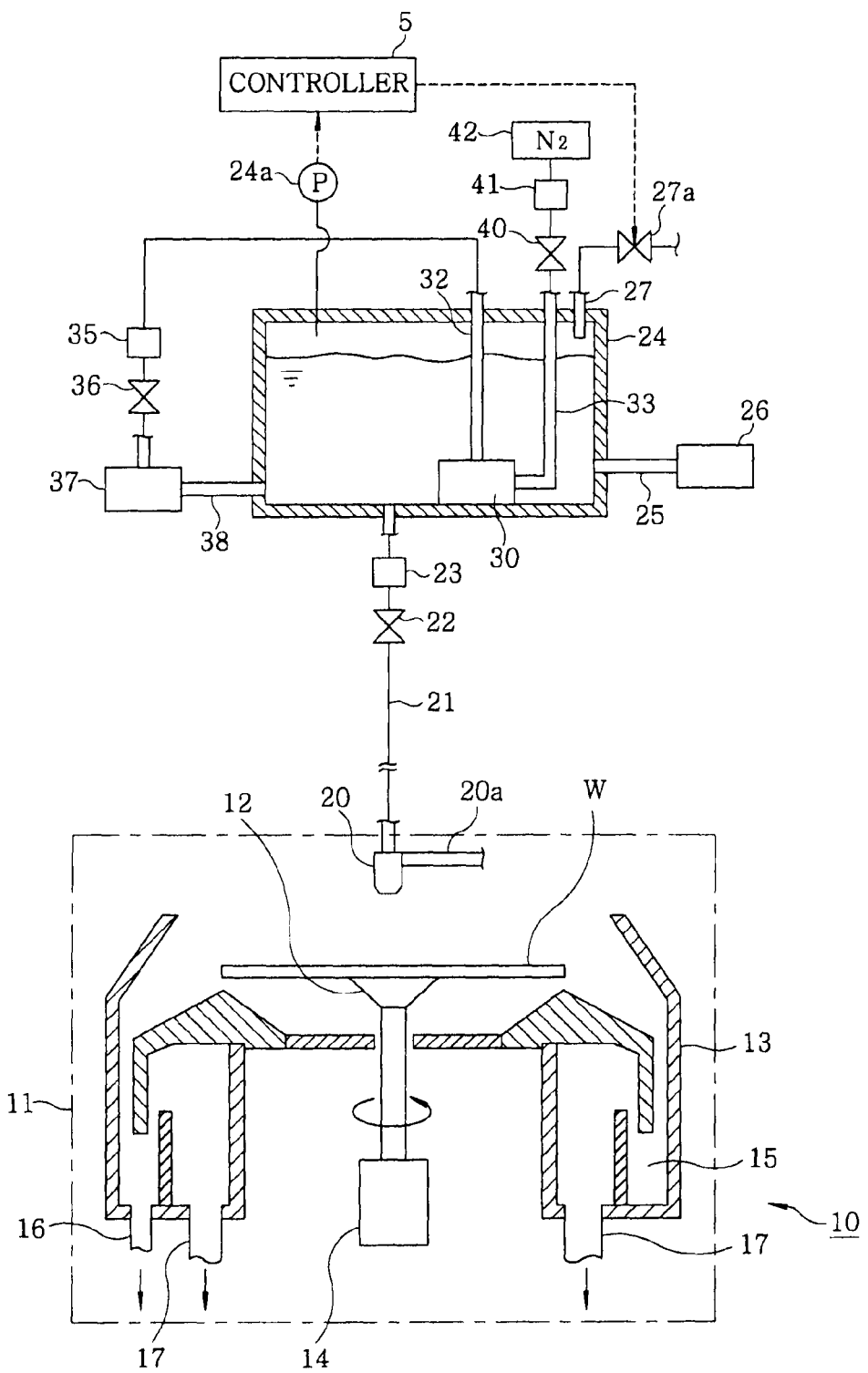
FIG. 1 illustrates an example of a coating unit as a part of an apparatus for forming a coating film which performs a method of manufacturing semiconductor in accordance with the present invention.

In FIG. 1, a coating unit 10 for coating a coating solution on the surface of a substrate, e.g., a semiconductor wafer (hereinafter, referred to as "wafer") W by a spin coating method is illustrated.

The coating unit 10 includes a housing 11. In the housing 11, a stage 12 serving as a mounting unit; and a cup 13 configured to surround the circumference of the wafer W mounted on the stage 12 are provided. The stage 12 as a vacuum chuck is configured to be vertically moved and rotated by a driving unit 14. A filter unit for making air current in the housing 11 is provided above the housing 11, which is omitted in the drawing.

A ring-shaped solution receiving unit 15 is provided on a bottom portion of the cup 13. One end of a waste solution channel 16 is connected to the solution receiving unit 15. Moreover, one end of an exhaust path 17 is connected to an inner periphery of the solution receiving unit 15 at a bottom portion of the cup 13. Therefore, a gas is separated from a waste solution to be discharged (exhausted).

Above the stage 12, a nozzle 20 for supplying the coating solution to the wafer W is provided. One end of a coating solution supply channel 21 is connected to the nozzle 20. The other end of the coating solution supply channel 21 is connected to the bottom of a coating solution storage tank 24 through a valve 22 and a mass flow controller 23. The nozzle 20 is configured to be vertically moved or vibrated by an arm 20a.

In the state where a precursor as a compound formed of an organic material including, e.g., Si, C, O, and H is dissolved in, e.g., an organic solvent, the precursor is stored in the coating solution storage tank 24 as the coating solution, i.e., the insulating film forming material. A coating solution supplementing tank 26 is connected to the side wall of the coating solution storage tank 24 through a coating solution supplementing channel 25. Provided on the top of the coating solution storage tank 24 is an exhaust path 27 for exhausting a gas (e.g., an inactive gas or a volatile organic solvent to be described later) in the coating solution storage tank 24. A vent valve 27a is interposed in the exhaust path 27. Moreover, a pressure gauge 24a is provided above the coating solution storage tank 24. When the pressure in the coating solution storage tank 24 is high, the vent valve 27a is opened by a controller 5.

A nano bubble generating apparatus 30 as a bubble generating unit for generating fine bubbles, i.e., nano bubbles, is provided on a bottom portion of the coating solution storage tank 24 to be dipped in the coating solution. Here, the "nano bubbles" are fine bubbles whose particle diameter is several nm.

The particle diameter of the bubbles is not limited to about several nm. However, when the particle diameter is too large, buoyancy is applied thereto and the bubbles gather on the surface of the film or go out to the air. Therefore, it is needed that the buoyancy is almost zero. As a result, it is necessary that the particle diameter be smaller than several hundreds nm.

Further, it is necessary that the bubbles be positively or negatively charged so that the bubbles are not agglutinated. In the present embodiment, the bubbles are negatively charged.

The nano bubble generating apparatus 30 for generating the nano bubbles will be described with reference to FIGS. 2A and 2B.

Figure 2A:
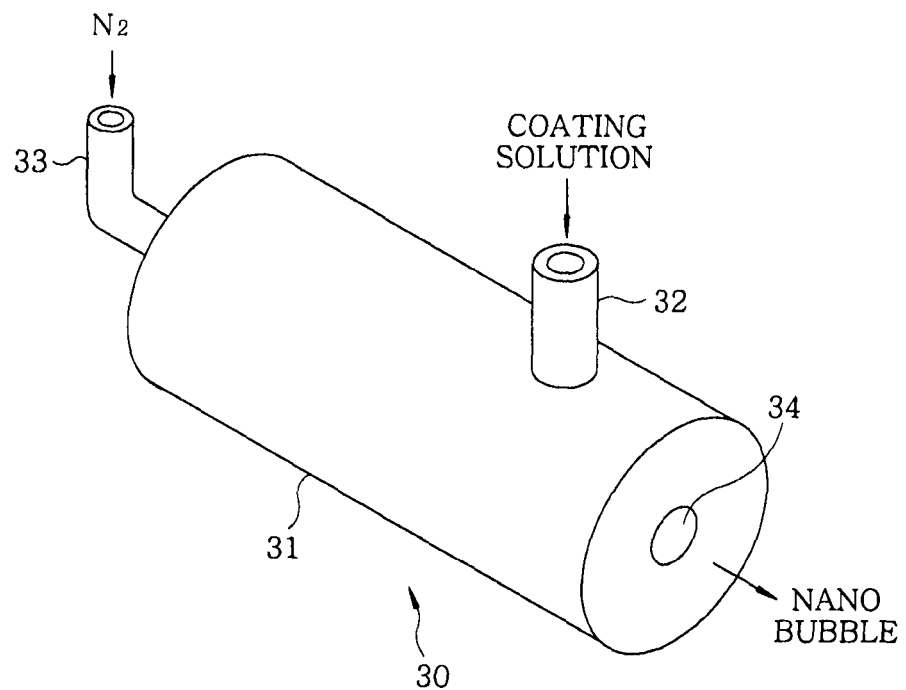
FIGS. 2A and 2B illustrate an example of an apparatus for generating nano bubbles in the coating unit of FIG. 1.
Figure 2B:
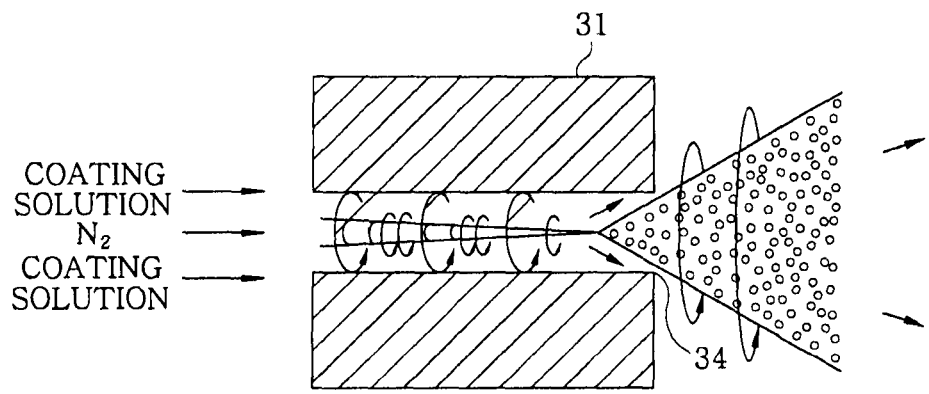
Figure 3:
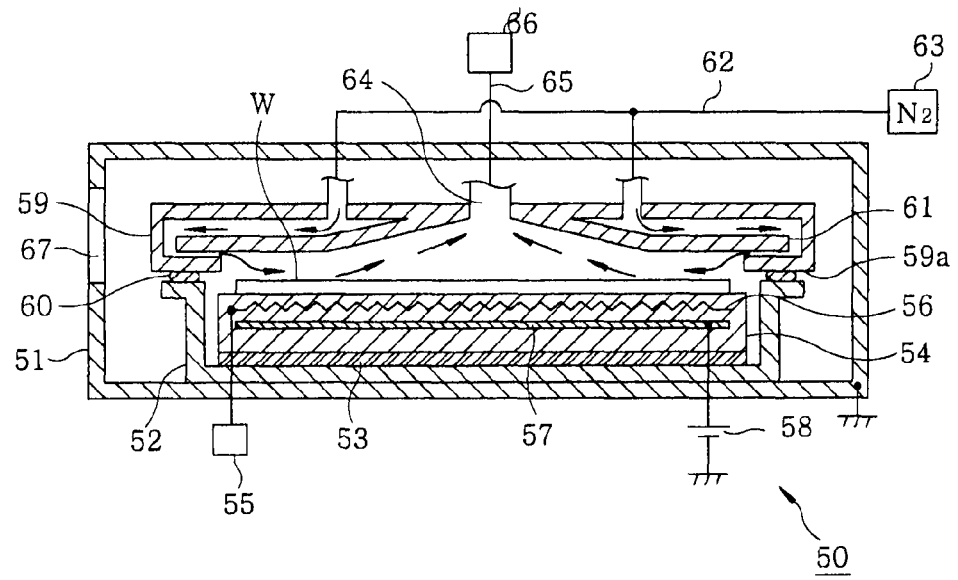
FIG. 3 is a vertical sectional view illustrating an example of a heating unit as a part of the apparatus for forming the coating film which performs the method of manufacturing semiconductor in accordance with the present invention.

The nano bubble generating apparatus 30 shown in FIGS. 2A and 2B is a micro bubble generating apparatus manufactured by a nano planet research institute corporation. As illustrated in FIG. 2A, the nano bubble generating apparatus 30 includes a cylindrical housing 31. One end of a coating solution supply channel 32 for supplying the coating solution to the housing 31 is connected onto an upper portion of a peripheral surface of the housing 31. A gas supply channel 33 for supplying a gas for generating the nano bubbles is connected to one end of the housing 31. An opening 34 is formed on the other end of the housing 31.

As illustrated in FIG. 1, a circulation pump 37 is connected to the other end of the coating solution supply channel 32 through a valve 35 and a mass flow controller 36. Moreover, one end (output side) of an absorbing channel 38 for absorbing the coating solution is connected to the circulation pump 37. Therefore, the circulation pump 37 supplies the coating solution in the coating solution storage tank 24 to the above nano bubble generating apparatus 30 through the coating solution supply channel 32. The other end of the absorbing channel 38 is connected to the lower side of the side wall of the coating solution storage tank 24.

The gas supply channel 33 is connected to a gas source for generating the nano bubbles, for example, a nitrogen gas source 42, through a valve 40 and a mass flow controller 41.

Processes of generating the nano bubbles by the nano bubble generating apparatus 30 will be described. When the coating solution is supplied to the housing 31, the coating solution violently rotates along the inner periphery of the housing 31 and flows to the opening 34 in the housing 31. Due to the flow of the coating solution, negative pressure of, e.g., 0.06 MPa (450 Torr) is generated like in a so-called absorber. The gas for generating the nano bubbles, which is supplied through the gas supply channel 33, is absorbed due to the negative pressure, so that the coating solution spirally flows toward the opening 34. The radius of the spirally flowing coating solution is gradually reduced as the coating solution spirally flows toward the opening 34. Therefore, as illustrated in FIG. 2B, the coating solution and the gas are violently mixed with each other at the other end of the housing 31, so that the nano bubbles are generated.

The nano bubbles have negative charge of, e.g., 40 to 100 mV due to the friction of the coating solution against the rotating current. Moreover, since the pressure in the nano bubbles is the negative pressure, the nano bubbles are contracted with the lapse of time after the nano bubbles are generated (reference: Tsunami Yui, Onari Hiroto, "Contraction Processes and Pattern of Micro Bubbles", First Micro Nano Bubble Technology Symposium).

The nano bubbles may be generated by, e.g., electrolysis instead of the above generating method.

Then, a heating unit 50 for heating the wafer W will be described with reference to FIG. 3. The heating unit 50 includes a housing 51. A heat plate supporting member 52 having a shape of a cup with a top side open is provided at a bottom portion of the housing 51. A heat plate 54 is provided in the heat plate supporting member 52 through an insulating plate 53. A heater 56 as a heating unit connected to a power source 55 is provided in the heat plate 54. Moreover, an electrode plate 57 is provided in the heat plate 54. A power source 58 as an electric field generating unit for applying a positive direct current (DC) voltage to the wafer W is connected to the electrode plate 57. An O-ring 60 inserted into a groove (not shown) is provided on a periphery of an upper surface of the heat plate supporting member 52. In addition, the housing 51 is grounded.

A rectifying top plate 59 is provided above the housing 51 to cover the wafer W on the heat plate 54 from an upper side of the wafer W. A flange 59a is formed at a bottom portion of an outer circumference of the top plate 59. A lifting unit (not shown) is connected to the top plate 59. When the top plate 59 is downwardly moved, the O-ring 60 of the heat plate supporting member 52 is pressed against and brought about contact with the flange 59a, so that the atmosphere around the wafer W is air-tightly kept.

A gas supply hole 61 is formed inside the flange 59a in a circumferential direction. One end of a gas supply channel 62 communicating with a gas supply hole 61 is connected to a top surface of the top plate 59. An inactive gas source 63 for supplying an inactive gas such as a nitrogen gas is connected to the other end of the gas supply channel 62.

In addition, an exhaust port 64 is formed at a center portion of the top plate 59. The atmosphere around the wafer W may be exhausted by an exhaust pump 66 from the exhaust port 64 through an exhaust path 65. In FIG. 3, reference numeral 67 denotes a transfer port of the wafer W.

Successively, an example of a method of manufacturing a semiconductor device in accordance with the present invention will be described with reference to FIGS. 4A to 6C. First, for example, the wafer W in which a wiring layer is formed in a lower layer is mounted by the stage 12 in the coating unit 10 by a transfer unit (not shown) to be attracted.

Figure 4A:
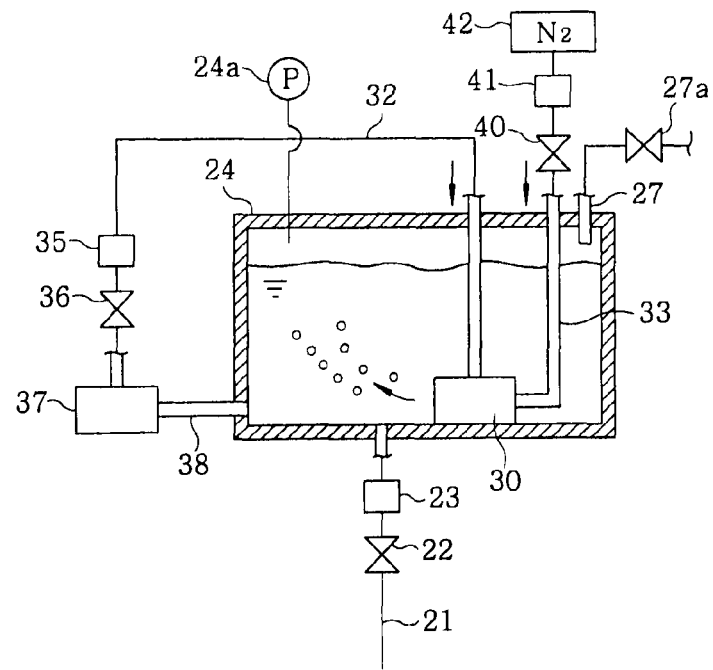
FIGS. 4A, 4B, and 4C illustrate how the nano bubbles are formed in the method of manufacturing semiconductor in accordance with the present invention.

As illustrated in FIG. 4A, the coating solution in the coating solution storage tank 24 is absorbed by the circulation pump 37, the coating solution is supplied to the aforementioned nano bubble generating apparatus 30, and a nitrogen gas is supplied from the nitrogen gas source 42 to the nano bubble generating apparatus 30. Due to the flow of the coating solution and the nitrogen gas, as described above, the nano bubbles are generated in the coating solution. The coating solution in which the nano bubbles are generated is discharged to the coating solution storage tank 24.

Figure 4B:
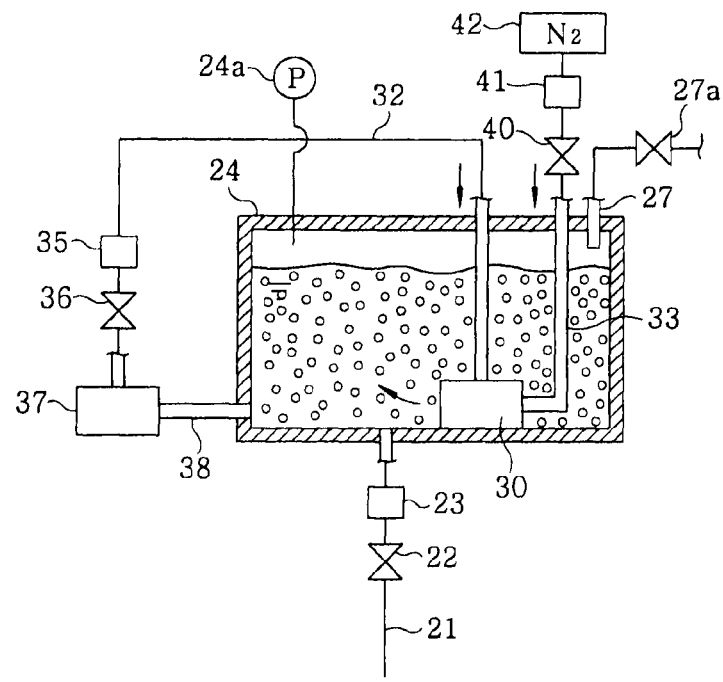

As the coating solution is circulated and the nitrogen gas is supplied for a predetermined time, as illustrated in FIG. 4B, the nano bubbles in the coating solution storage tank 24 are increased in number. The nano bubbles are negatively charged as described above. Therefore, the nano bubbles are prevented from being agglutinated to be uniformly dispersed in the coating solution and, accordingly, the nano bubbles are separated from each other. In addition, when the air pressure in the coating solution storage tank 24 is increased by the generation of the volatile organic solvent or the nano bubbles, the vent valve 27a is opened by a detection signal of the pressure gauge 24a. Therefore, the gas is exhausted from the exhaust path 27.

After a predetermined amount of nano bubbles are generated, the circulation of the coating solution and the supply of the nitrogen gas are stopped, so that the generation of the nano bubbles is stopped. Then, when the coating solution in which the nano bubbles are generated is maintained during a predetermined period of time, as illustrated in FIG. 4C, the nano bubbles in the coating solution get contracted and the particle diameter thereof becomes, e.g., about 10 nm.

At this time, when the pressure in the nano bubbles is higher than that of the coating solution due to the contraction of the nano bubbles, for example, the gas in the nano bubbles partially leaks to the coating solution. The leaking gas is dissolved in the coating solution or becomes bubbles again to be received into a low dielectric constant film 81, which will be described later, together with the nano bubbles. However, the leaking gas yields no harmful influence on the characteristics of the low dielectric constant film 81.

Figure 4C:
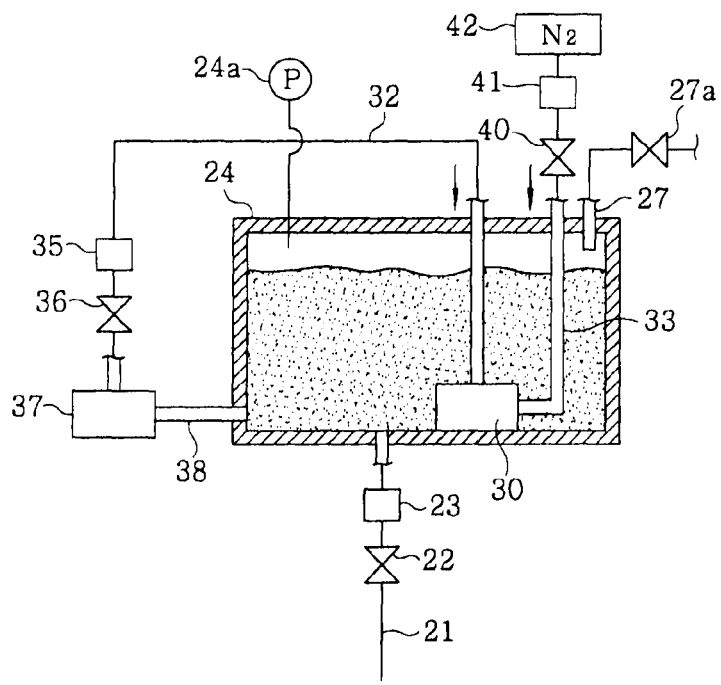

Next, in FIGS. 4A to 4C, with respect to the valves 22, 35, and 40, white means that the valves are opened and black means that the valves are closed. In FIGS. 4A to 4C, the valves are partially simplified.

Figure 5C:
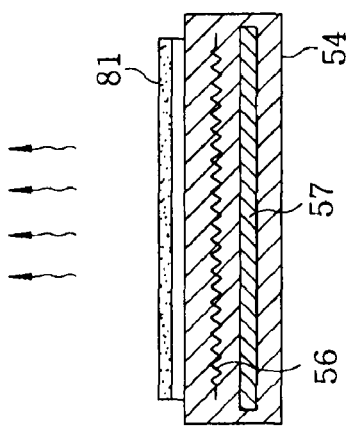
FIGS. 5A, 5B, and 5C illustrate how a low dielectric constant film is formed in the method of manufacturing semiconductor in accordance with the present invention.
Figure 5B:
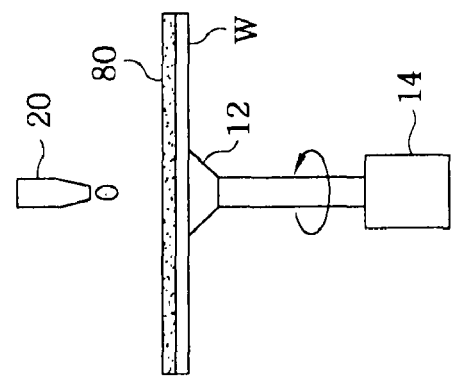
Figure 5A:
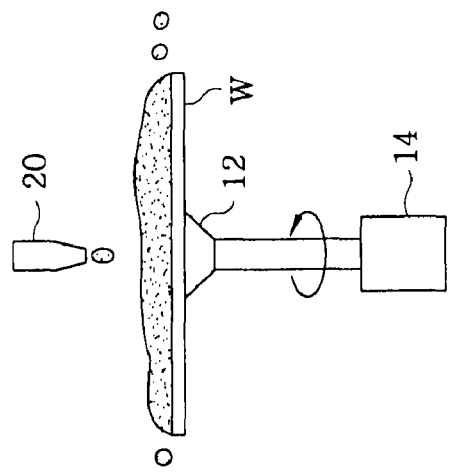
Figure 6A:
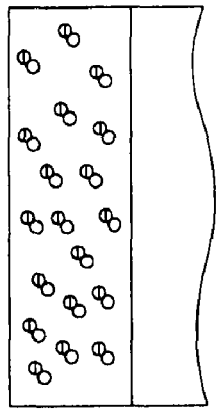
FIGS. 6A, 6B, and 6C illustrate the shapes of the nano bubbles in low dielectric constant films illustrated in FIGS. 5B and 5C.

Then, as illustrated in FIG. 5A, the coating solution is supplied to a center portion of the wafer W by the nozzle 20 and the stage 12 is rotated at predetermined number of times, so that a surplus coating solution is scattered. Therefore, the coating solution of a predetermined film thickness is coated on the wafer W; the solvent is slightly evaporated; and a coating film 80 is formed (FIG. 5B). At this time, since the nano bubbles are negatively charged as described above, the nano bubbles are uniformly dispersed in the coating film 80 as illustrated in FIG. 6A.

Thereafter, the wafer W is taken out from the coating unit 10 by a transfer unit (not shown) and is mounted on the heat plate 54 in the heating unit 50. Then, the top plate 59 is downwardly moved, so that the atmosphere around the wafer W is sealed up. The nitrogen gas, for example, is supplied from the gas supply hole 61 to the wafer W, and the nitrogen gas is exhausted from the exhaust port 64.

Figure 6B:
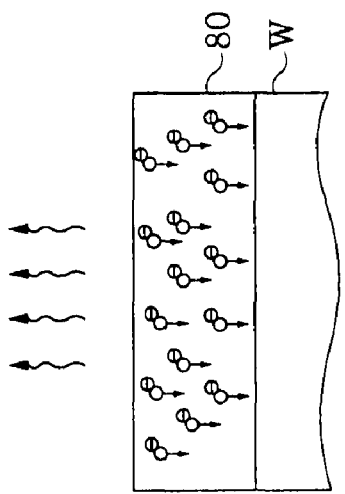

Successively, as illustrated in FIG. 5C, the wafer W on which the coating film 80 is formed is heated at a predetermined temperature and a positive direct current (DC) voltage is applied to the wafer W. The solvent in the coating film 80 evaporates by the heating. Therefore, the rising current of the solvent is microscopically formed in the coating film 80. For that reason, the nano bubbles are likely to rise in accordance with the rising current of the solvent. Moreover, since the nano bubbles slightly expand by the heating, buoyancy increases allowing the nano bubbles to rise in an upper direction of the coating film 80. In the meantime, since the positive DC voltage is applied to the coating film 80, the negatively charged nano bubbles may be downwardly attracted as illustrated in FIG. 6B. Accordingly, when the proper magnitude of the DC voltage is grasped in advance by experiments, the high dispersion state of the nano bubbles that are almost the same as that of the nano bubbles before being heated may be maintained by using a balance between such an upward force acting on the nano bubbles and such a downward force acting on the nano bubbles. In addition, when the rising tendency of the nano bubbles during the heating is extremely small, for example, the viscosity of the coating solution before being heated is high, or the buoyancy of the nano bubbles is extremely small, the DC voltage may not be applied.

Figure 6C:
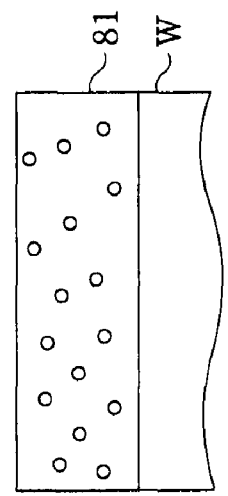

The solvent evaporates from the coating film 80 by the heating and the precursor in the coating film 80 is reacted thereto, so that the crosslink structure of Si, C, O, and H is formed. Therefore, when the viscosity of the coating film 80 is increased, it becomes difficult for the nano bubbles to vibrate. For that reason, the nano bubbles may be soaked in the pores. As illustrated in FIG. 6C, the low dielectric constant film 81 in which pores having a size of, e.g., about 10 nm are uniformly dispersed may be obtained.

Figure 7A:
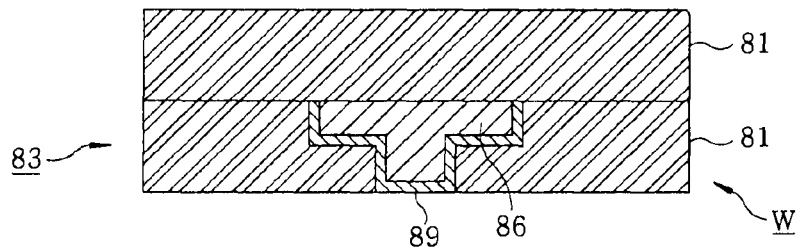
FIGS. 7A to 7D are cross sectional views illustrating an example of a device having the low dielectric constant film illustrated in FIGS. 5A to 5C and 6C.
Figure 7B:
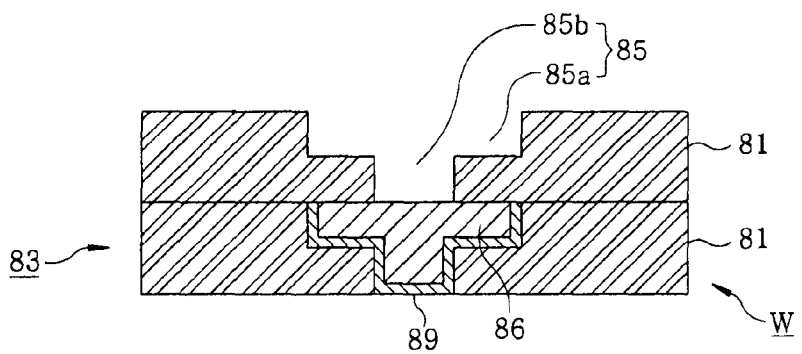
Figure 7C:
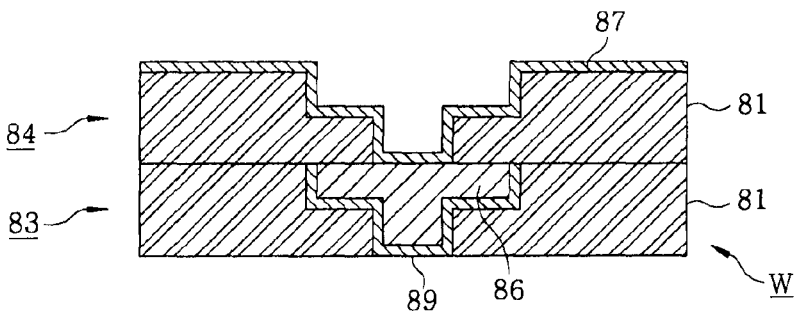
Figure 7D:
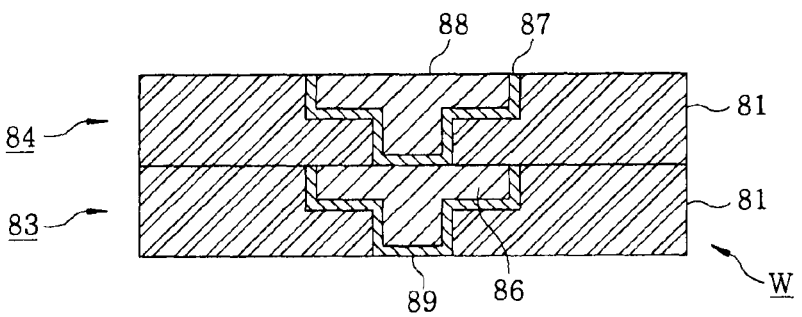

Thereafter, the wafer W is taken out from the heating unit 50 and, for example, plasma etching is performed on the low dielectric constant film 81 formed on a lower layer circuit 83 illustrated in FIG. 7A to form a recessed portion 85 that includes a trench 85a for forming a wiring and a via hole 85b. At a bottom portion of the recessed part 85, a lower layer wiring 86 is exposed (FIG. 7B). Then, a conductive barrier metal 87, a laminated film of, e.g., Ta and Ti, is formed on the surface of the low dielectric constant film 81 that includes an inside of the recessed portion 85 (FIG. 7C). Successively, Cu is buried in the recessed portion 85, and surplus Cu and the barrier metal 87 on the surface of the low dielectric constant film 81 are removed by chemical mechanical polishing (CMP) to form a wiring 88 electrically connected to the wiring 86. Therefore, an upper layer circuit 84 is laminated on the lower layer circuit 83 (FIG. 7D). As described above, the circuits are sequentially laminated to form a multilayer wiring structure. In addition, reference numeral 89 denotes a barrier metal in the lower layer circuit 83.

In accordance with the above embodiment, the negatively charged fine nano bubbles having almost zero buoyancy are dispersed in the coating solution as the insulating film forming material, and the coating film 80 is formed by using the coating solution. Then, the coating film 80 is heated to be baked. Therefore, the extremely small pores (nano bubbles) may be easily formed in the coating film 80. Especially, the nano bubbles are negatively charged, so that the nano bubbles separate from each other, thereby dispersing with high uniformity. Accordingly, it is possible to obtain the uniform porous low dielectric constant film 81. In accordance with the present embodiment, since a compound for obtaining the porous film is not necessary, it is not needed to select or develop such the compound. Therefore, the porous low dielectric constant film 81 may be easily manufactured. That is, in accordance with the present invention, the porous low dielectric constant film 81 may be easily manufactured by the coating method.

Further, as described above, after the nano bubbles are generated, if the time that it takes to heat the nano bubbles in order to form the low dielectric constant film 81 is given longer, the nano bubbles are contracted. In this case, the pores may be made small as well.

As described above, the nano bubbles are made porous while being soaked in the low dielectric constant film 81, so that the low dielectric constant film 81 is not surrounded by open pores but closed pores are formed. For that reason, when the barrier metal 87 is formed in the recessed portion 85, the penetration of the barrier metal 87 into the low dielectric constant film 81 is prevented. Therefore, it is possible to prevent deterioration in an insulation property caused by the penetration of the barrier metal 87. Moreover, since the nano bubbles are the closed pores, the mechanical strength of the film may be improved. In addition, it is possible to prevent the film from being damaged by a plasma process such as etching.

The amount of the nano bubbles can be adjusted by changing the time when the nano bubbles are generated in the coating solution to control a pore rate in the low dielectric constant film 81.

In addition, in order to allow a particle diameter of the nano bubbles in the coating film 80 to be no more than a preset size, a filter may be interposed in the coating solution supply channel 21. In this case, the nano bubbles having a larger diameter than the preset diameter are blocked in the filter to be stopped and only the nano bubbles having a smaller diameter than the preset diameter are supplied. The blocked and stopped large diameter nano bubbles are contracted and, then, pass through the filter (in this case, the contraction of the nano bubbles is accelerated by allowing the coating solution to stay longer in the filter).

Figure 8:
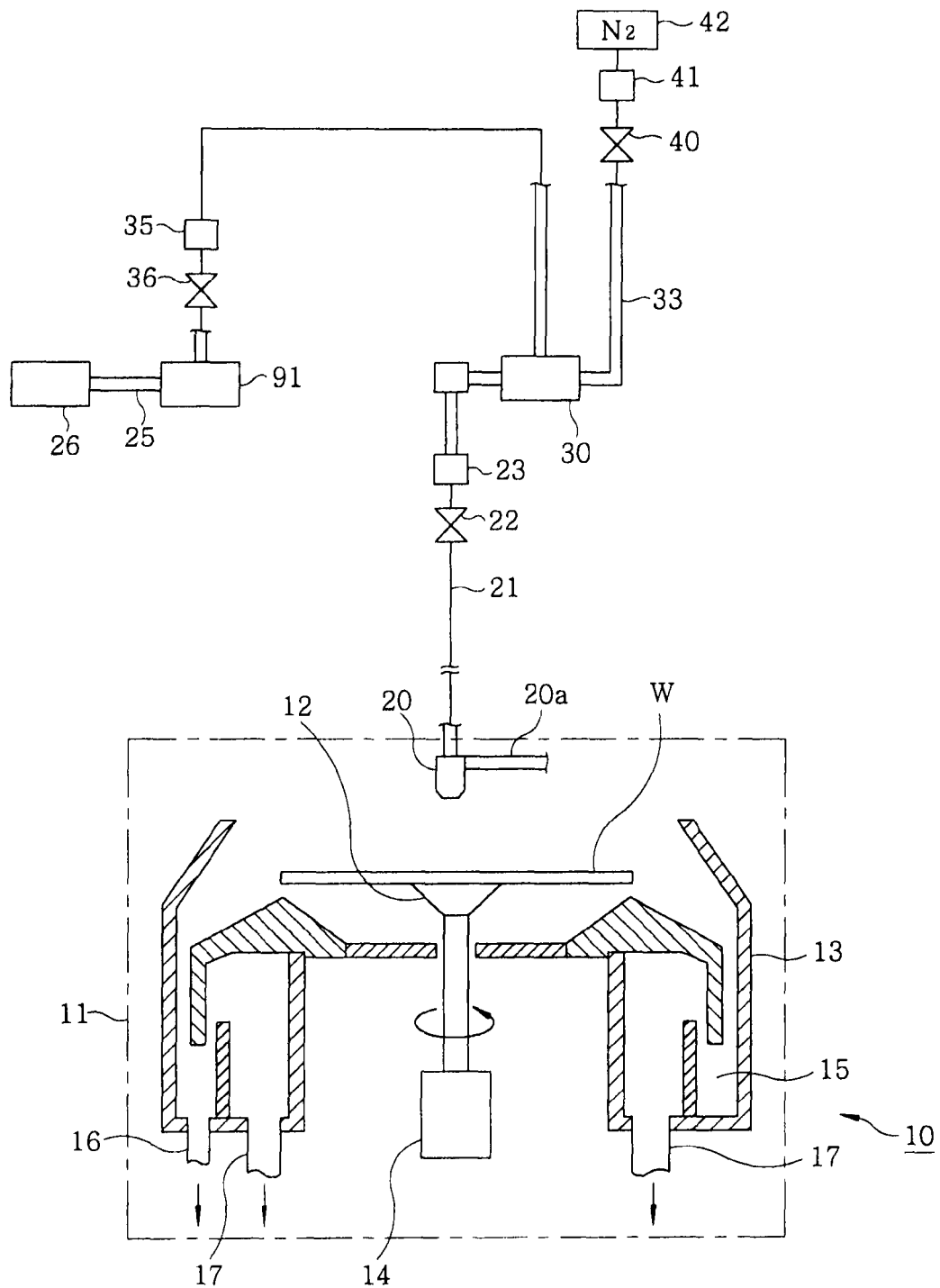
FIG. 8 illustrates another example of the coating unit as a part of the apparatus for forming the coating film which performs the method of manufacturing semiconductor in accordance with the present invention.

When the filter is used, the coating solution storage tank 24 may not be provided unlike the above case, but the coating solution may be directly supplied from the coating solution supplementing tank 26 to the nano bubble generating apparatus 30, for example, as illustrated in FIG. 8. In FIG. 8, reference numeral 90 denotes the filter and reference numeral 91 denotes a solution transfer pump. In such a structure, the porous low dielectric constant film 81 may be obtained as described above. In FIG. 8, the same elements of apparatus as those of the apparatus illustrated in FIG. 1 are denoted by the same reference numerals.

However, when the large diameter nano bubbles are not included immediately after the nano bubbles are generated, the nano bubbles may be used without being contracted.

In the above embodiment, the nitrogen gas is used for generating the nano bubbles. However, another inactive gas such as an Ar gas may be used or an active gas may be used. When an $O_2$ gas, for example, is used as the active gas, nano bubbles are generated by the $O_2$ gas. Then, when the nano bubbles are contracted and, thus, internal pressure is high, the gas is activated by the energy. When the nano bubbles are generated, combination in the coating solution, for example, combination with, e.g., silicon in the organic material is cut off so that a carbon chain becomes short and molecules become small. When the low dielectric constant film 81 is formed based on the precursor having small molecules, the SiOCH particles in the low dielectric constant film 81 become small. In the above-described etching process, since etching is performed on each SiOCH particle, when etching is performed on the low dielectric constant film 81, the outline of the low dielectric constant film 81 becomes sharp. That is, a finer processing can be performed.

Moreover, in the present embodiment, an action (caused by an electric field) of attracting the nano bubbles during the heating of the wafer W is applied. However, the same attracting action may be applied when the coating film 80 is formed. In addition, the nano bubbles are negatively charged so that the nano bubbles are attracted to the wafer W by the positive DC voltage. However, a negative DC voltage from above the wafer W may be applied to repel the nano bubbles to the wafer W. Of course, the relationship between positive and negative charges may be reversely used. That is, the nano bubbles may be positively charged so that the nano bubbles may be attracted to the wafer W.

Further, in the present embodiment, the wafer W on which the coating film 80 is formed is heated only once to be baked. However, the number of times of the heating is not limited to one, but the number of times of the heating may be two or more depending on the kind of the coating film 80 or the like.

Figure 9:
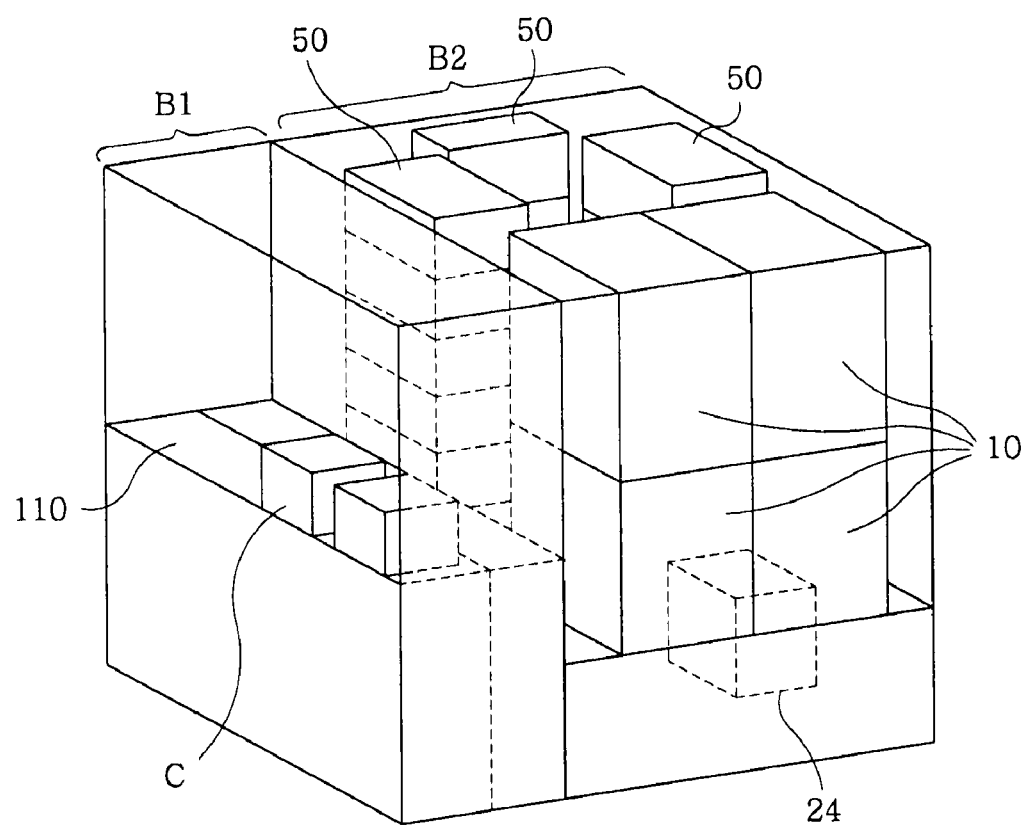
FIG. 9 is a perspective view illustrating an example of the apparatus for forming the coating film which performs the method of manufacturing semiconductor in accordance with the present invention.
Figure 10:
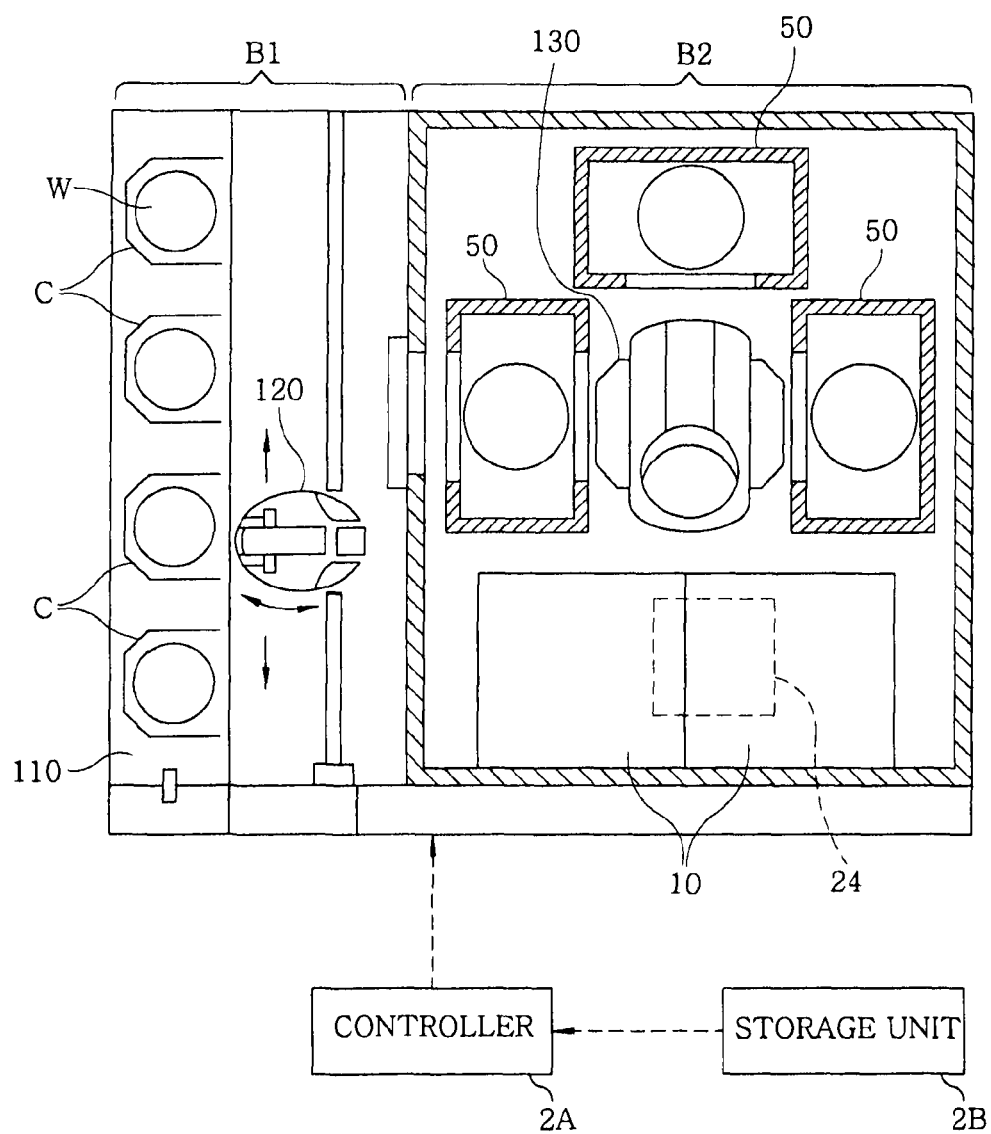
FIG. 10 is a transversal cross sectional view illustrating the apparatus for forming the coating film illustrated in FIG. 9.
Figure 11A:
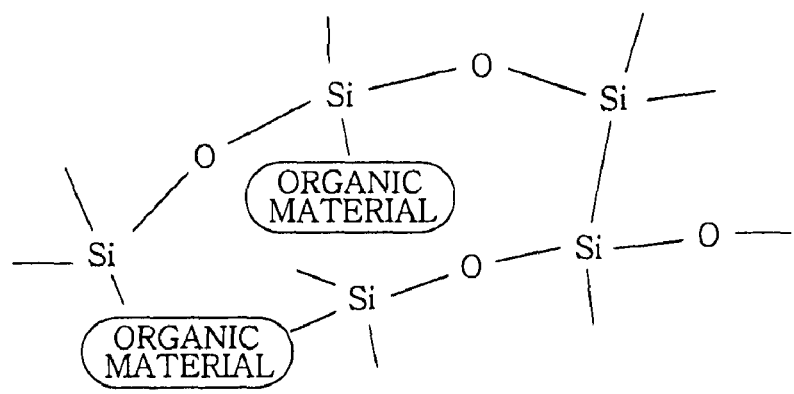
FIGS. 11A and 11B are concept views illustrating a conventional method of forming pores in the low dielectric constant film.
Figure 11B:
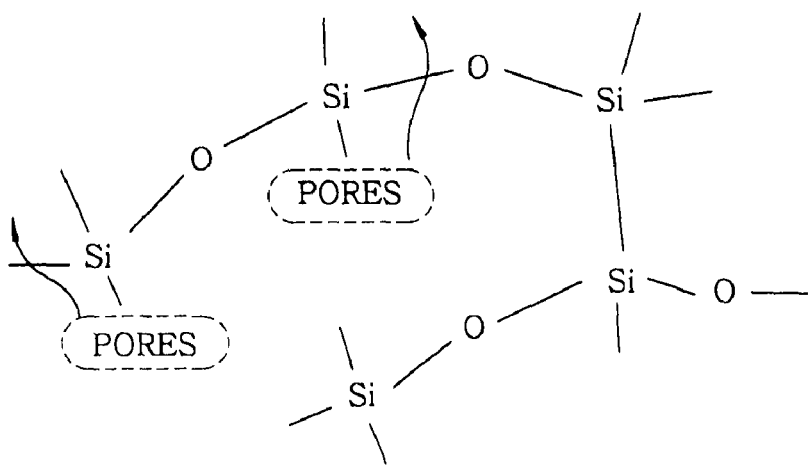

Next, an example of a coating film forming apparatus as the semiconductor manufacturing apparatus including the coating unit 10 and the heating unit 50 will be described with reference to FIGS. 9 and 10.

The coating film forming apparatus includes a carrier mounting section B1 from and to which a carrier C as a transfer container in which a plurality of, e.g., 25 wafers W are accommodated in the form of a shelf is unloaded and loaded; and a processing section B2 for performing a coating or a heating process on the wafers W.

Provided in the carrier mounting section B1 are a carrier station 110 in which the carrier C is mounted; and a first transfer unit 120 for transferring the wafers W between the carrier C and the processing section B2.

In the processing section B2, the coating units 10 and the heating units 50 are respectively provided in a plural number. Further, there is provided a second transfer unit 130 for transferring the wafers W between the coating units 10 and the heating units 50. The first transferring unit 120 enters the processing section B2, so that the wafers W are transferred between the first transferring unit 120 and the second transferring unit 130. In the present embodiment, the coating solution storage tank 24 in which the nano bubble generating apparatus 30 is arranged is provided below a group of the coating units 10. The coating solution storage tank 24 is shared by the coating units 10 in the present embodiment. That is, in the present embodiment, the coating solution storage tank 24, the supply source for supplying the coating solution to the coating units 10, is connected thereto.

In the coating film forming apparatus, a controller 2A formed of, e.g., a computer is provided. The controller 2A includes a data processing unit having a program, a memory, and a central processing unit (CPU), and the like. The program has commands of sending control signals from the controller 2A to the respective parts of the coating film forming apparatus; and of executing the above steps to process or transfer the wavers W. Moreover, in the memory, there is provided a region in which the values of processing parameters such as processing pressure, processing temperature, processing time, gas flow rate, a power value and/or the like are written. When the CPU executes the respective commands of the program, the values of the process parameters of the commands are read and the control signals corresponding to the values of the parameters are sent to the respective parts of the coating film forming apparatus. The program (including a program related to the input manipulation or display of the process parameter) is typically stored in a storage unit 2B as a computer storage medium, e.g., a flexible disk, a compact disk, a magneto-optical (MO) disk, and a hard disk to be installed in the controller 2A.

The movement of the wafers W in the coating film forming apparatus will be briefly described. First, the carrier C in which a plurality of wafers W is accommodated is mounted in the carrier station 110. The wafers W are removed from the carrier C by the first transferring unit 120 and are guided to the second transferring unit 130. Successively, the wafers W are loaded into the coating unit 10 by the second transferring unit 130. Then, after the coating film 80 is formed, the wafers W are loaded into the heating unit 50 by the second transferring unit 130. Then, after forming the above low dielectric constant film 81, the wafers W are returned to the carrier C in a route reverse to the loading route by the second transferring unit 130 and the first transferring unit 120.

While the invention has been shown and described with respect to the embodiments, it will be understood by those skilled in the art that various changes and modifications may be made without departing from the scope of the invention as defined in the following claims.

What is claimed is:

1. A method of manufacturing a semiconductor device, comprising steps of:
   generating positively or negatively charged fine bubbles having substantially zero buoyancy in a coating solution as an insulating film forming material;
   coating the coating solution including the bubbles on a substrate to form a coating film; and
   baking the coating film by heating the substrate before the bubbles are removed to obtain a porous low dielectric constant insulating film.

2. The method of claim 1, wherein the low dielectric constant insulating film serves as an interlayer dielectric film.

3. The method of claim 1, wherein the insulating film forming material includes silicon, oxygen, carbon, and hydrogen.

4. The method of claim 1, wherein, after the coating film is baked, diameters of the bubbles are equal to or smaller than 50 nm.

5. The method of claim 1, wherein the step of baking the coating film includes forming an electric field to attract the bubbles in the coating solution to the substrate.

6. A storage medium in which a computer program is stored, wherein the computer program includes steps for performing the method of manufacturing a semiconductor device of claim 1.

7. A semiconductor manufacturing apparatus, comprising:
   a bubble generating unit for generating positively or negatively charged fine bubbles having substantially zero buoyancy in a coating solution as an insulating film forming material;
   a coating unit for coating a coating solution including the bubbles on a substrate for forming a semiconductor device to form a coating film;
   a heating unit for baking the coating film by heating the substrate on which the coating solution including the bubbles is coated to obtain a porous low dielectric constant insulating film; and
   a transfer unit for transferring the substrate between the coating unit and the heating unit.

8. The apparatus of claim 7, wherein the heating unit includes an electric field generating unit for forming an electric field for attracting the bubbles in the coating solution to the substrate.

* * * * *